United States Patent
Shin et al.

(10) Patent No.: US 9,741,425 B2
(45) Date of Patent: Aug. 22, 2017

(54) MEMORY DEVICE AND MEMORY SYSTEM INCLUDING THE MEMORY DEVICE

(71) Applicant: SK hynix Inc., Gyeonggi-do (KR)

(72) Inventors: Sun-Hye Shin, Gyeonggi-do (KR); Nak-Kyu Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 49 days.

(21) Appl. No.: 14/696,030

(22) Filed: Apr. 24, 2015

(65) Prior Publication Data
US 2016/0155490 A1 Jun. 2, 2016

(30) Foreign Application Priority Data
Nov. 27, 2014 (KR) .................. 10-2014-0167376

(51) Int. Cl.
  G11C 11/406 (2006.01)
  G11C 11/408 (2006.01)
  G11C 11/4096 (2006.01)

(52) U.S. Cl.
  CPC ...... *G11C 11/4085* (2013.01); *G11C 11/4087* (2013.01); *G11C 11/40603* (2013.01); *G11C 11/40618* (2013.01); *G11C 11/4096* (2013.01)

(58) Field of Classification Search
  CPC .................................................. G11C 11/406
  USPC ....................................................... 365/222
  See application file for complete search history.

(56) References Cited

U.S. PATENT DOCUMENTS

| | | | | |
|---|---|---|---|---|
| 4,725,987 A * | 2/1988 | Cates | ........................ | G11C 7/10 365/189.04 |
| 4,914,630 A * | 4/1990 | Fujishima | ............. | G11C 11/406 365/189.04 |
| 6,535,950 B1 * | 3/2003 | Funyu | .................. | G11C 7/1042 365/222 |
| 7,379,323 B2 * | 5/2008 | Miyamoto | .............. | G11C 11/22 365/145 |
| 8,908,431 B2 * | 12/2014 | Shim | ...................... | G11C 16/10 365/185.02 |
| 9,384,821 B2 * | 7/2016 | Bains | .................. | G06F 13/1636 |
| 2004/0190326 A1 * | 9/2004 | Shigenami | ............ | G11C 11/406 365/146 |
| 2012/0170392 A1 * | 7/2012 | Lim | ...................... | G11C 7/1072 365/194 |
| 2016/0019974 A1 * | 1/2016 | Blodgett | ............... | G06F 11/106 365/185.03 |

FOREIGN PATENT DOCUMENTS

KR  100810040  3/2008

* cited by examiner

*Primary Examiner* — Min Huang
(74) *Attorney, Agent, or Firm* — IP & T Group LLP (57) ABSTRACT

A memory device includes a first memory bank comprising first and second memory blocks; a second memory bank comprising third and fourth memory blocks; and a bank selection unit suitable for selecting a memory bank corresponding to a bank address among the first and the second memory banks when an active command is applied, wherein the selected memory bank performs row access on a word line of an unselected memory block, while activating a word line of a memory block that is selected by a block address among memory blocks of the selected memory bank.

18 Claims, 6 Drawing Sheets

MEMORY DEVICE AND MEMORY SYSTEM INCLUDING THE MEMORY DEVICE

CROSS-REFERENCE TO RELATED APPLICATION(S)

The present application claims priority of Korean Patent Application No. 10-2014-0167376, filed on Nov. 27, 2014, which is incorporated herein by reference in its entirety.

BACKGROUND

1. Field

Exemplary embodiments of the present invention relate to a memory device and a memory system including the memory device.

2. Description of the Related Art

A computing system uses a memory device, such as dynamic random access memory (DRAM), in order to store data accessed by a central processing unit (CPU) or a processor. A computing system requires higher performance the technologies develop. To this end, memory devices are subject to higher density integration and higher speed. In order to increase operating speed of a memory device, various methods for efficiently driving circuits included in the memory device are being discussed in addition to a method of increasing the frequency of a clock at which the memory device operates.

Figure 1:
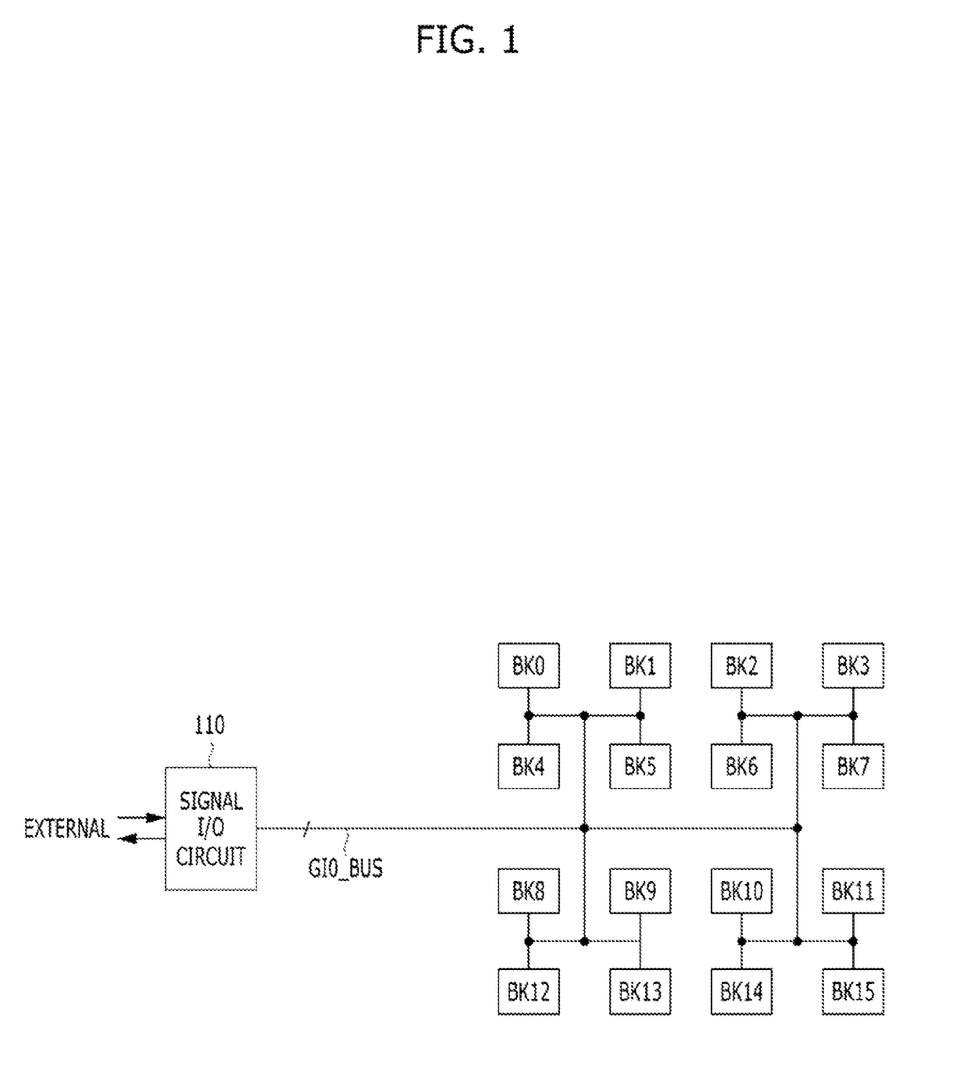
FIG. 1 is a diagram illustrating the operation of a memory device.

A memory device may include a plurality of memory banks. Referring to FIG. 1, a memory device may include a plurality of memory banks BK0-BK15, a signal input/output (I/O) circuit 110, and a global bus GIO_BUS.

The memory banks BK0-BK15 may be identified by bank addresses based on a single storage unit that includes a plurality of memory cells. The memory device may receive command signals and addresses applied thereto and may input and output data through the signal I/O circuit 110. The global bus GIO_BUS may transfer data between the memory banks BK0-BK15 and the data I/O circuit 110.

A method for alternately accessing the plurality of memory banks BK0-BK15 may be used as a method for increasing the bandwidth of the memory device. For example, while a memory bank BK0 is activated and data is inputted and outputted, another memory bank BK3 may be activated, thereby consecutively inputting and outputting data of the plurality of memory banks BK0-BK15. In this case, an interval of tRRD (Row address strobe to Row address strobe Delay) is required between active commands applied for the two active operations. Such tRRD is defined in the specification and may be commonly set to be longer than tRCD (Row address strobe to Column address strobe Delay) or tCCD (Column address strobe to Column address strobe Delay).

In general, if a single memory bank is to be activated, a single selected word line is activated and memory cells connected to the activated word line are accessed. During this operation, the remaining word lines of the same memory bank may maintain an inactive state. It may be difficult to increase the bandwidth of a memory device or efficiently drive the memory device through such control of the memory bank.

SUMMARY

Various embodiments are directed to a memory device and a memory system, which are capable of increasing a bandwidth by simultaneously activating two or more word lines in a single memory bank and sequentially accessing memory cells connected to the activated word lines.

Also, various embodiments are directed to a memory device and a memory system, which are capable of efficiently managing memory banks by refreshing other word lines along with an active operation for a single word line in an activated memory bank.

In an embodiment, a memory device includes a first memory bank comprising first and second memory blocks; a second memory bank comprising third and fourth memory blocks; and a bank selection unit suitable for selecting a memory bank corresponding to a bank address among the first and the second memory banks when an active command is applied, wherein the selected memory bank performs row access on a word line of an unselected memory block, while activating a word line of a memory block that is selected by a block address among memory blocks of the selected memory bank.

In an embodiment, a memory device includes a first memory bank comprising first and second memory blocks; a second memory bank comprising third and fourth memory blocks; and a bank selection unit suitable for selecting a memory bank corresponding to a bank address among the first and the second memory banks when an active command is applied, wherein in a single mode, the selected memory bank activates a word line of a memory block that is selected by a block address among memory blocks of the selected memory bank, and in a dual mode, the selected memory bank performs row access on a word line of an unselected memory block other than the selected memory block while activating the word line of the selected memory block.

In an embodiment, a memory system includes a memory device, comprising a first memory bank comprising first and second memory blocks and a second memory bank comprising third and fourth memory blocks, and suitable for activating a word line of a memory block selected by a block address in a memory bank that is selected by a bank address among the first and the second memory banks while performing row access on a word line of an unselected memory block other than the selected memory block, when an active command is applied; and a memory controller suitable for applying the active command, the bank address, and the block address to the memory device.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless referred to the contrary.

Hereinafter, row access may include one or more of an operation for activating a word line, an operation for performing a normal refresh on a word line, and an operation for performing a target refresh on a word line. Furthermore, column access may include one or more of an operation for reading the data of a memory cell and an operation for writing data in a memory cell.

Figure 2:
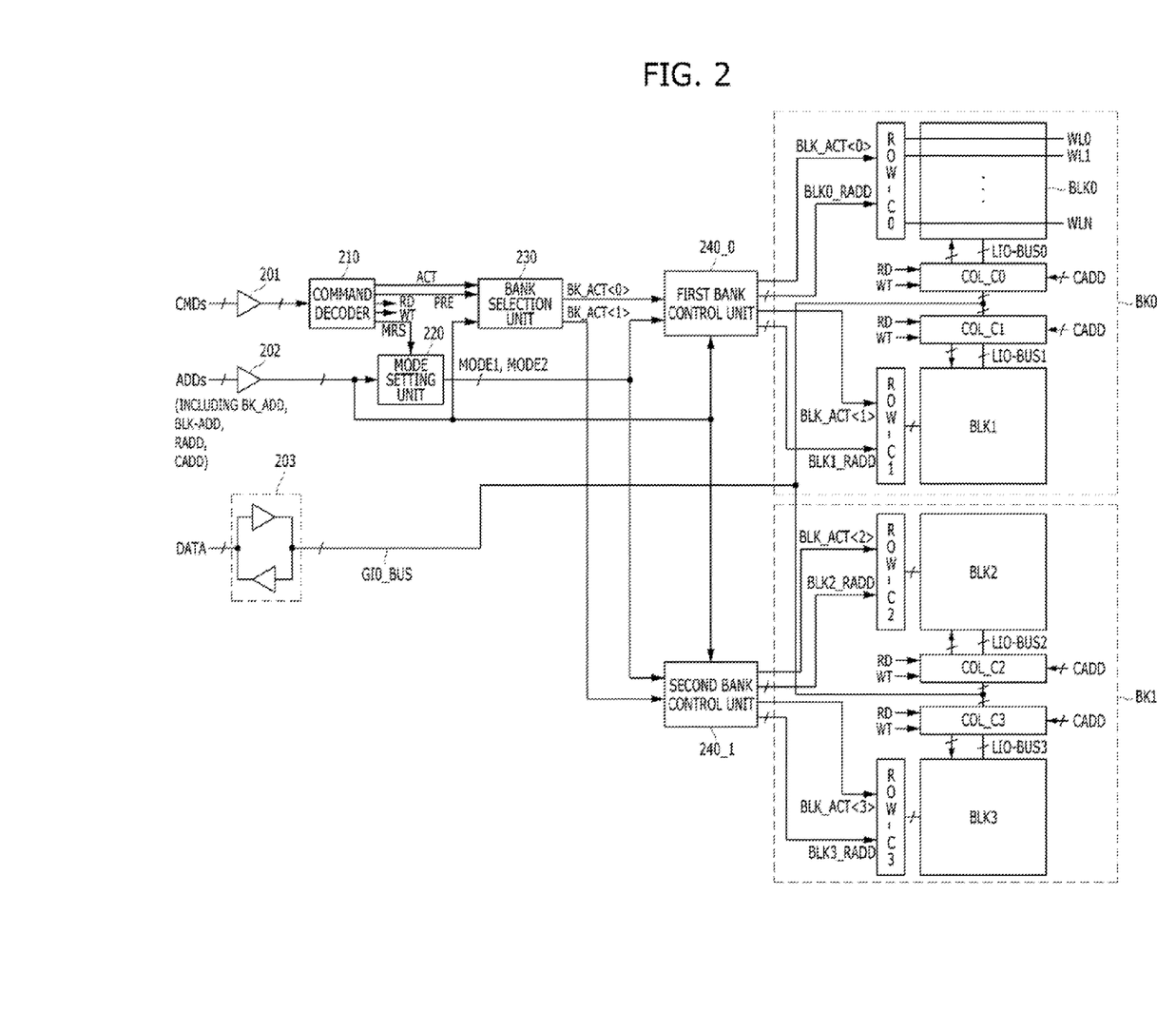
FIG. 2 is a diagram illustrating the configuration of a memory device in accordance with an embodiment of the present invention.

FIG. 2 is a diagram illustrating the configuration of a memory device in accordance with an embodiment of the present invention.

Referring to FIG. 2, the memory device may include a command input unit 201, an address input unit 202, a data I/O unit 203, a command decoder 210, a mode setting unit 220, a bank selection unit 230, first and second bank control units 240_0 and 240_1, first and second memory banks BK0 and BK1, and a global bus GIO_BUS.

The command input unit 201 may receive a plurality of command signals CMDs. The address input unit 202 may receive addresses ADDs. The data I/O unit 203 may receive or output data DATA. Each of the command signals CMDs, the addresses ADDs, and the data DATA may include signals of multiple bits. In particular, the addresses ADDs may include a bank address BK_ADD for selecting a memory bank, a block address BLK_ADD for selecting a memory block, a row address RADD for selecting a row line, and a column address CADD for selecting a column line. The addresses BK_ADD, BLK_ADD, and RADD may be applied along with an active command, and the address CADD may be applied along with read/write commands.

The command decoder 210 may generate an active command ACT, a precharge command PRE, a read command RD, a write command WT, and a mode register set command MRS in response to the command signals CMDs received through the command input unit 201. If a combination of the command signals CMDs corresponds to the active command ACT, the command decoder 210 may activate the active command ACT. If a combination of the command signals CMDs corresponds to the precharge command PRE, the command decoder 210 may activate the precharge command PRE. Furthermore, if a combination of the command signals CMDs corresponds to the read command RD, the command decoder 210 may activate the read command RD. If a combination of the command signals CMDs corresponds to the write command WT, the command decoder 210 may activate the write command WT. If a combination of the command signals CMDs corresponds to the mode register set command MRS, the command decoder 210 may activate the mode register set command MRS.

When the mode register set command MRS is activated, the mode setting unit 220 may set any one of operation modes including a single mode and a dual mode using the addresses ADDs received through the address input unit 202. The single mode may be an operation mode in which a single word line is activated in a selected memory bank, and the dual mode may be an operation mode in which two or more word lines are activated in a selected memory bank. The mode setting unit 220 may activate a mode signal MODE1 if the single mode is set and may activate a mode signal MODE2 If the dual mode is set.

The bank selection unit 230 may generate first and second bank active signals BK_ACT<0:1> in response to the bank address BK_ADD, the active command ACT, and the precharge command PRE. The first bank active signal BK_ACT<0> may correspond to the first memory bank BK0, and the second bank active signal BK_ACT<1> may correspond to the second memory bank BK1. The bank selection unit 230 may activate the bank active signals BK_ACT<0:1> selected by the bank address BK_ADD in response to the active command ACT and may deactivate activated bank active signals BK_ACT<0:1> in response to the precharge command PRE.

The first and the second bank control units 240_0 and 240_1 may correspond to and control the first and the second memory banks BK0 and BK1, respectively, according to the single mode or the dual mode, based on a set mode. The bank control units 240_0 and 240_1 may generate block active signals BLK_ACT<0:3> corresponding to respective memory blocks BLK0-BLK3 that are included in the first and second memory banks BK0 and BK1.

If the single mode is set, when a bank active signal BK_ACT<0:1> is activated, the bank control unit 240_0 or 240_1 may activate a block active signal BLK_ACT<0:3> corresponding to a memory block selected by the block address BLK_ADD. For example, in a first mode, when the bank active signal BK_ACT<0> is activated and the first memory block BLK0 is selected by the block address BLK_ADD, the first bank control unit 240_0 may activate the first block active signal BLK_ACT<0>. Furthermore, the first bank control unit 240_0 may transfer the row address RADD as address information BLK0_RADD corresponding to the selected first memory block BLK0 among pieces of address Information BLK0_RADD-BLK3_RADD.

If the dual mode is set, when a bank active signal BK_ACT<0:1> is activated, the bank control unit 240_0 or 240_1 may activate a block active signal BLK_ACT<0:3> corresponding to a memory block, selected by the block address BLK_ADD, and a block active signal BLK_ACT<0:3> corresponding to an unselected memory block, that is, a memory block other than the selected memory block in the corresponding memory bank BK0 or BK1, together. For example, in a second mode, if the bank active signal BK_ACT<0> is activated and the first memory block BLK0 is selected by the block address BLK_ADD, the first bank control unit 240_0 may activate the first block active signal BLK_ACT<0> corresponding to the selected first memory block BLK0 and the second block active signal BLK_ACT<1> corresponding to an unselected second memory block BLK1 together. Furthermore, the first bank control unit 240_0 may transfer the row address RADD as address information BLK0_RADD and BLK1_RADD corresponding to the selected first memory block BLK0 and the unselected second memory block BLK1, among pieces of address information BLK0_RADD-BLK3_RADD.

For reference, if an activated bank active signal BK_ACT<0:1> is deactivated, the bank control unit 240_0 or 240_1 may deactivate an activated block active signal BLK_ACT<0:3>.

The first memory bank BK0 may include the first and the second memory blocks BLK0 and BLK1, first and second block control units ROW_C0, ROW_C1, COL_C0, and COL_C1, and first and second local buses LIO_BUS0 and LIO_BUS1. Furthermore, the second memory bank BK1 may include the third and the fourth memory blocks BLK2 and BLK3, third and fourth block control units ROW_C2, ROW_C3, COL_C2, and COL_C3, and third and fourth local buses LIO_BUS2 and LIO_BUS3.

Each of the memory blocks BLK0-BLK3 may include a plurality of word lines WL0-WLN (for simplicity, only the word lines of the memory block BLK0 are illustrated, and the word lines of the remaining memory blocks BLK1-BLK3 are not illustrated) and a plurality of memory cells (not illustrated in FIG. 2) connected to the word lines. The block control units may include the respective row control units ROW_C0-ROW_C3 and the respective column control units COL_C0-COL_C3.

The row control units ROW_C0-ROW_C3 may activate respective word lines, selected based on address information BLK0_RADD-BLK3_RADD, in a section in which the corresponding one of the block active signals BLK_ACT<0:3> has been activated. The column control units COL_C0-COL_C3 may transfer data between respective local buses LIO_BUS0-LIO_BUS3 and the global bus GIO_BUS.

The column control units COL_C0-COL_C3 may control the column access operations of the respective memory blocks BLK0-BLK3 In response to the command RD, WT and the column address CADD. When the read command RD is activated, the column control units COL_C0-COL_C3 may control the memory blocks BLK0-BLK3 so that the data of columns selected by the column address CADD are transferred to the respective column control units COL_C0-COL_C3 through respective local buses LIO_BUS0-LIO_BUS3. The column control units COL_C0-COL_C3 may transfer the data of the respective local buses LIO_BUS0-LIO_BUS3 to the global bus GIO_BUS. When the write command WT is activated, the column control units COL_C0-COL_C3 may transfer the data of the global bus GIO_BUS to the respective local buses LIO_BUS0-LIO_BUS3. Furthermore, the column control units COL_C0-COL_C3 may control the respective memory blocks BLK0-BLK3 so that the data of the respective local buses LIO_BUS0-LIO_BUS3 are transferred to columns selected by the column address CADD.

The global bus GIO_BUS may transfer data between a selected memory bank and the data I/O unit 203. When a read operation is performed, the global bus GIO_BUS may transfer data outputted by a selected memory bank to the data I/O unit 203. When a write operation is performed, the global bus GIO_BUS may transfer data inputted to the data I/O unit 203 to a selected memory bank.

An operation of the memory device is described below based on the aforementioned contents.

(1) If the Memory Device is Set in the Single Mode

In this example, the address ADDs for selecting a word line of the first memory block BLK0 of the first memory bank BK0 has been applied to the memory device along with the active command CMDs and after a lapse of time tRCD, the column address CADD for selecting some memory cells of the first memory block BLK0 has been applied to the memory device along with the read command CMDs. In this case, the column address CADD may include the block address BLK_ADD.

The first bank active signal BK_ACT<0> is activated in response to the active command ACT, and the first block active signal BLK_ACT<0> is activated in response to the first bank active signal BK_ACT<0>. A word line that is selected by the row address RADD among word lines of the selected first memory block BLK0 is activated in response to the first block active signal BLK_ACT<0>.

When the read command RD is activated, the data of memory cells connected to the activated word line of the first memory block BLK0 is transferred to the global bus GIO_BUS through the first local bus LIO_BUS0 and outputted outside the memory device. In this case, the data of the first local bus LIO_BUS0 may be the data of memory cells selected by the column address CADD.

(2) If the Memory Device is Set in the Dual Mode

In this example, the address ADDs for selecting a word line of the first memory block BLK0 of the first memory bank BK0 have been applied to the memory device along with the active command CMDs, and the column address CADD for selecting some memory cells of the first memory block BLK0 has been applied to the memory device along with the write command WT after a lapse of a time tRCD, and the column address CADD for selecting some memory cells of the second memory block BLK1 has been applied to the memory device along with the read command RD after a lapse of a time tCCD. In this case, the column address CADD may include the block address BLK_ADD.

The first bank active signal BK_ACT<0> is activated in response to the active command ACT, and the first and the second block active signals BLK_ACT<0> and BLK_ACT<1> are activated in response to the first bank active signal BK_ACT<0>. A word line that is selected by the row address RADD among word lines of the selected first memory block BLK0 is activated in response to the first block active signal BLK_ACT<0>. Furthermore, a word line that is selected by the row address RADD among word lines of the unselected second memory block BLK1 is activated in response to the second block active signal BLK_ACT<1>.

When the write command WT is activated, the data of the global bus GIO_BUS is transferred to memory cells connected to the activated word line of the first memory block BLK0 through the first local bus LIO_BUS0 and written in the memory cells. In this case, the memory cells in which the data is written may be memory cells selected by the column address CADD.

When the read command RD is activated, the data of memory cells connected to the activated word line of the second memory block BLK is transferred to the global bus GIO_BUS through the second local bus LIO_BUS1 and outputted outside the memory device. In this case, the data of the second local bus LIO_BUS1 may be the data of memory cells selected by the column address CADD.

A memory device may increase its bandwidth by activating two or more word lines in a single memory bank in response to an active command and performing column access to the two or more word lines at a specific interval.

Figure 3:
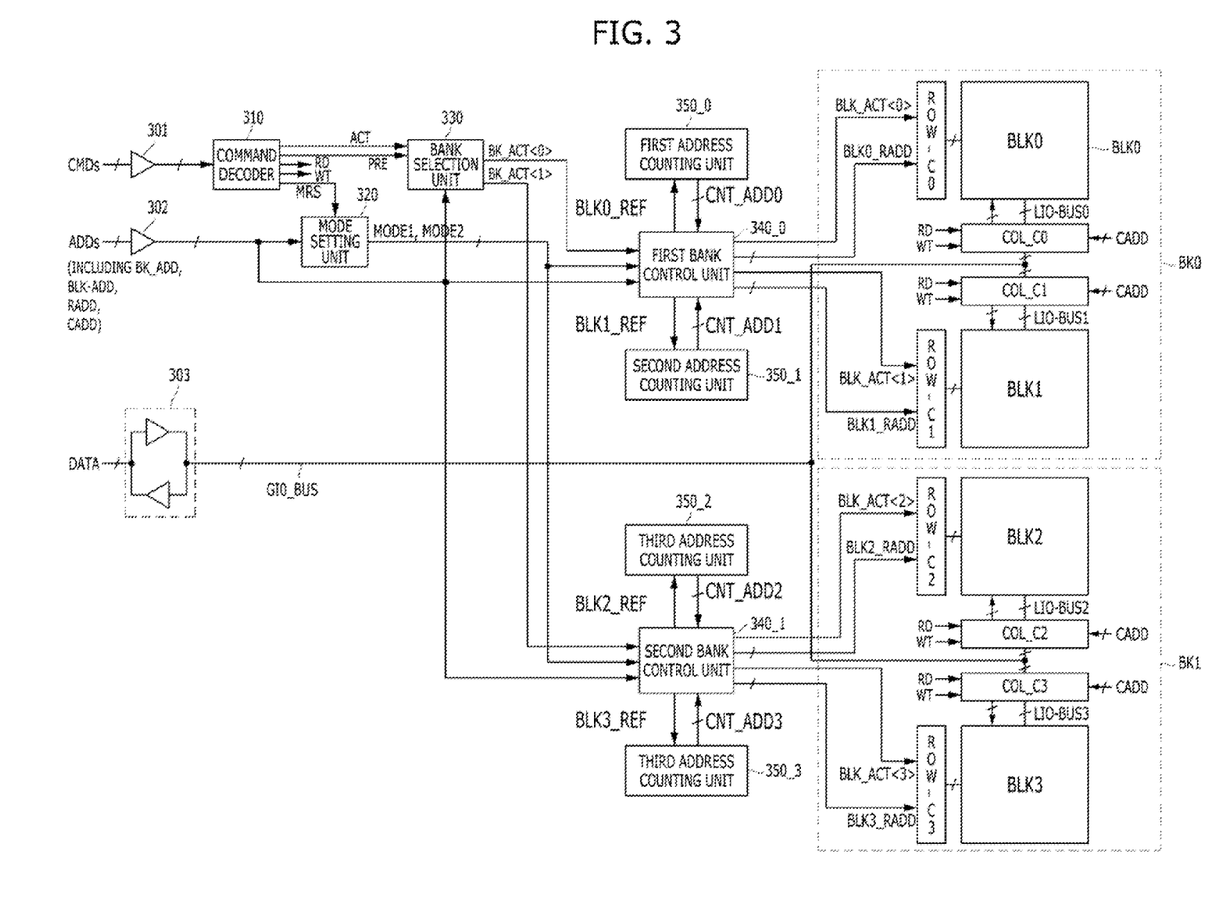
FIG. 3 is a diagram illustrating the configuration of a memory device in accordance with an embodiment of the present invention.

FIG. 3 is a diagram illustrating the configuration of a memory device in accordance with an embodiment of the present invention.

Referring to FIG. 3, the memory device may include a command input unit 301, an address input unit 302, a data I/O unit 303, a command decoder 310, a mode setting unit 320, a bank selection unit 330, first and second bank control units 340_0 and 340_1, first and second memory banks BK0 and BK1, a global bus GIO_BUS, and first to fourth address counting units 350_0-350_3.

Unlike the memory device of FIG. 2, the memory device of FIG. 3 may activate a word line of a selected memory block and also perform a normal refresh on word lines of an unselected memory block.

When a mode register set command MRS is activated, the mode setting unit 320 may set one of the operation modes, including a single mode and a dual mode, using addresses ADDs received through the address input unit 202. The single mode may be an operation mode in which a single word line is activated in a selected memory bank, and the dual mode may be an operation mode in which a word line of a selected memory block is activated and word lines of an unselected memory block are subject to a normal refresh in a selected memory bank. The mode setting unit 220 may activate a mode signal MODE1 If the single mode is set and may activate a mode signal MODE2 if the dual mode is set.

The first and the second bank control units 340_0 and 340_1 may respectively correspond to and control the first and the second memory banks BK0 and BK1 according to the first or second mode based on a set mode. The bank control units 340_0 and 340_1 may generate block active signals BLK_ACT<0:3> corresponding to respective memory blocks BLK0-BLK3 included in the first and second memory banks BK0 and BK1.

If the single mode is set, the operation of the bank control unit 340_0 or 340_1 may be the same as that of the bank control unit 240_0 or 240_1 of FIG. 2 that is set in the single mode.

If the dual mode is set, when a bank active signal BK_ACT<0:1> is activated, the bank control unit 340_0 or 340_1 may activate a block active signal BLK_ACT<0:3> corresponding to a memory block selected by a block address BLK_ADD and simultaneously activate a block active signal BLK_ACT<0:3> corresponding to an unselected memory block, that is, the other memory block than the selected memory block in the corresponding memory bank BK0 or BK1, for a specific section. For example, in a second mode, if the bank active signal BK_ACT<0> is activated and the first memory block BLK0 is selected by the block address BLK_ADD, the first bank control unit 340_0 may activate the first block active signal BLK_ACT<0> corresponding to the selected first memory block BLK0 and simultaneously activate the second block active signals BLK_ACT<1> corresponding to the unselected second memory block BLK1 for a specific section.

Furthermore, the bank control unit 340_0 or 340_1 may transfer a row address RADD as address information that corresponds to the selected memory block and may transfer a counting address CNT_ADD0-CNT_ADD3 as address information that corresponds to the unselected memory block. For example, if the first memory block BLK0 of the first memory bank BK0 is selected, the first bank control unit 340_0 may transfer the row address RADD as the address information BLK0_RADD and transfer the counting address CNT_ADD0 as the address information BLK1_RADD.

The bank control units 340_0 and 340_1 may generate block refresh signals BLK0_REF-BLK3_REF, by activating a block refresh signal corresponding to an unselected memory block whenever the bank active signal BK_ACT<0:1> is activated.

The first to the fourth address counting units 350_0-350_3 correspond to the first to the fourth memory blocks BLK0-BLK3, respectively. The address counting units 350_0-350_3 may increase the respective values of the counting addresses CNT_ADD0-CNT_ADD3 by 1 whenever the corresponding one of the block refresh signals BLK0_REF-BLK3_REF is activated. To increase the value of each of the counting addresses CNT_ADD0-CNT_ADD3 by 1 may mean that each of the counting addresses CNT_ADD0-CNT_ADD3 is changed so that a $(K+1)^{th}$ word line WLK+1 is selected after a $K^{th}$ word line WLK has been selected.

An operation of the memory device is described below based on the aforementioned contents.

(1) If the memory device is set in the single mode, the operation of the memory device may be the same as that of the memory device of FIG. 2 that is set in the first mode.

(2) If the memory device is set in the dual mode

In this example, the address ADDs for selecting a word line of the first memory block BLK0 of the first memory bank BK0 has been applied to the memory device along with the active command CMDs and, after a lapse of a time tRCD, the column address CADD for selecting some memory cells of the first memory block BLK0 has been applied to the memory device along with the write command WT. In this case, the column address CADD may Include the block address BLK_ADD.

The first bank active signal BK_ACT<0> is activated in response to the active command ACT and the first block active signal BLK_ACT<0> is activated in response to the first bank active signal BK_ACT<0>, so the second block active signal BLK_ACT<1> may be activated for a specific section. A word line selected by the row address RADD in the selected first memory block BLK0 Is activated in response to the first block active signal BLK_ACT<0>. Furthermore, a word line selected by the counting address CNT_ADD1 in an unselected second memory block BLK1 is subject to active-precharge (i.e., refresh) in response to the second block active signal BLK_ACT<1>.

When the write command WT is activated, the data of the global bus GIO_BUS is transferred to memory cells connected to the activated word line of the first memory block BLK0 through the first local bus LIO_BUS0 and written in the memory cells. In this case, the memory cells in which the data is written may be memory cells selected by the column address CADD.

A memory device may efficiently manage memory banks by simultaneously performing an active operation on a single word line and a normal refresh operation on other word lines in an activated memory bank.

Figure 4:
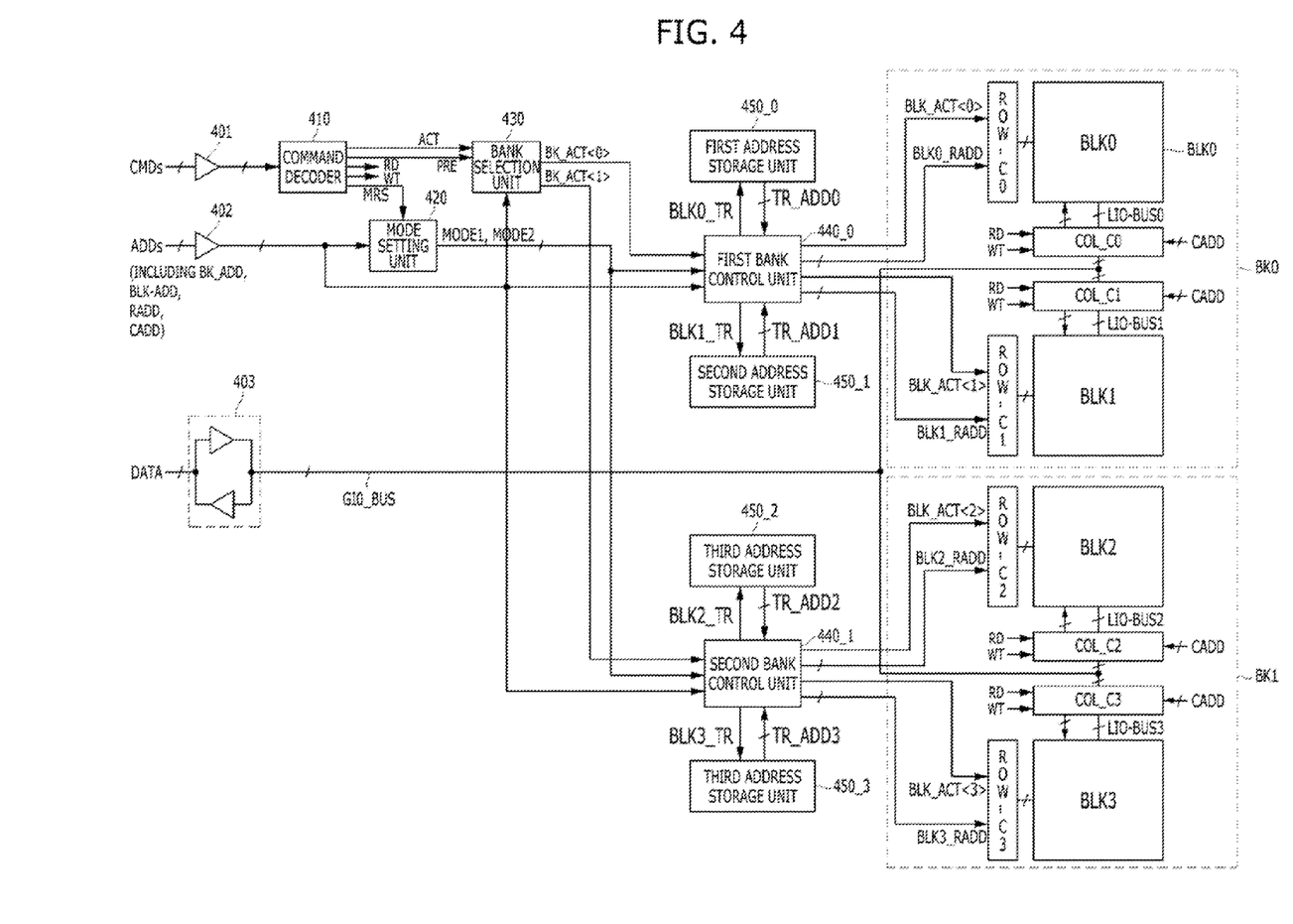
FIG. 4 is a diagram illustrating the configuration of a memory device in accordance with an embodiment of the present invention.

FIG. 4 is a diagram illustrating the configuration of a memory device in accordance with an embodiment of the present invention.

Referring to FIG. 4, the memory device may include a command input unit 401, an address input unit 402, a data I/O unit 403, a command decoder 410, a mode setting unit 420, a bank selection unit 430, first and second bank control units 440_0 and 440_1, first and second memory banks BK0 and BK1, a global bus GIO_BUS, and first to fourth address storage units 450_0-450_3.

Unlike the memory device of FIG. 2, the memory device of FIG. 4 may activate a word line of a selected memory block and simultaneously perform a target refresh on word lines of an unselected memory block. Unlike the sequential refresh of all the word lines included in a memory bank, a target refresh may mean that word lines connected to memory cells having a shorter retention time are refreshed. Hereinafter, a target refresh may be performed using target addresses generated using addresses stored in the address storage units 450_0-450_3.

When a mode register set command MRS is activated, the mode setting unit 420 may set one of the operation modes, including a single mode and a dual mode, using addresses ADDs received through the address input unit 402. The single mode may be an operation mode in which a single word line is activated and accessed in an activated memory bank, and the dual mode may be an operation mode in which a word line of a selected memory block is activated and accessed and simultaneously word lines of an unselected memory block are subject to a target refresh in an activated memory bank. The mode setting unit 420 may activate a mode signal MODE1 if the single mode is set and may activate a mode signal MODE2 If the dual mode is set.

The first and the second bank control units 440_0 and 440_1 may correspond to and control the first and the second memory banks BK0 and BK1, respectively, according to the first or second mode based on a set mode. The bank control units 440_0 and 440_1 may generate block active signals BLK_ACT<0:3> corresponding to respective memory blocks BLK0-BLK3 included in the first and second memory banks BK0 and BK1.

If the single mode is set, the operation of the bank control unit 440_0 or 440_1 may be the same as that of the bank control unit 240_0 or 240_1 of FIG. 2 that is set in the first mode.

If the dual mode is set, when a bank active signal BK_ACT<0:1> is activated, the bank control unit 440_0 or 440_1 may activate a block active signal BLK_ACT<0:3> corresponding to a memory block selected by a block address BLK_ADD and may also activate a block active signal BLK_ACT<0:3> corresponding to an unselected memory block, that is, a memory block other than the selected memory block in the corresponding memory bank BK0 or BK1, for a specific section. For example, in a second mode, if the bank active signal BK_ACT<0> is activated and the first memory block BLK0 is selected by the block address BLK_ADD, the first bank control unit 440_0 may activate the first block active signal BLK_ACT<0> corresponding to the selected first memory block BLK0 and may also activate the second block active signal BLK_ACT<1> corresponding to the unselected second memory block BLK1 for a specific section.

Furthermore, the bank control unit 440_0 or 440_1 may transfer a row address RADD as address information that corresponds to the selected memory block and may transfer a target address TR_ADD0-TR_ADD3 as address Information that corresponds to the unselected memory block. For example, if the first memory block BLK0 of the first memory bank BK0 is selected, the first bank control unit 440_0 may transfer the row address RADD as the address Information BLK0_RADD and transfer the target address TR_ADD0 as the address information BLK1_RADD.

The bank control units 440_0 and 440_1 may generate target refresh signals BLK0_TR-BLK3_TR, by activating a target refresh signal corresponding to an unselected memory block whenever a corresponding bank active signal BK_ACT<0:1> is activated.

The first to the fourth address storage units 450_0-450_3 correspond to the first to the fourth memory blocks BLK0-BLK3, respectively. The address storage units 450_0-450_3 may output the respective target addresses TR_ADD0-TR_ADD3 whenever the respective target refresh signals BLK0_TR-BLK3_TR are activated. The target addresses TR_ADD0-TR_ADD3 may be generated as follows.

Each of the address storage units 450_0-450_3 may store Information on the active number, active history, or active time of each of the word lines of a corresponding memory block, may compare the information with reference information (i.e., a reference number, reference frequency, or reference time), and may store the row address RADD of a word line having the active number equal to or greater than the reference number, the active frequency equal to or higher than the reference frequency, or the active time equal to or longer than the reference time as a result of the comparison. Thereafter, when the corresponding one of the target refresh signals BLK0_TR-BLK3_TR is activated, the address storage units 450_0-450_3 may generate the target addresses TR_ADD0-TR_ADD3, respectively, by adding 1 to the stored address or subtracting 1 from the stored address and output the generated target address. Each of the target addresses TR_ADD0-TR_ADD3 generated as described above may be the address of a word line adjacent to the word line having the active number equal to or greater than the reference number, the active frequency equal to or higher than the reference frequency, or the active time equal to or longer than the reference time.

An operation of the memory device is described below based on the aforementioned contents.

(1) If the memory device is set in the single mode, the operation of the memory device may be the same as that of the memory device of FIG. 2 that is set in the first mode.

(2) If the memory device is set in the dual mode

In this example, the address ADDs for selecting a word line of the first memory block BLK0 of the first memory bank BK0 has been applied to the memory device along with the active command CMDs and after a lapse of a time tRCD, the column address CADD for selecting some memory cells of the first memory block BLK0 has been applied to the memory device along with the read command RD. In this case, the column address CADD may include the block address BLK_ADD.

The first bank active signal BK_ACT<0> is activated in response to the active command ACT and the first block active signal BLK_ACT<0> is activated in response to the first bank active signal BK_ACT<0>, so that the second block active signal BLK_ACT<1> may be activated for a specific section. A word line selected by the row address RADD in the selected first memory block BLK0 is activated in response to the first block active signal BLK_ACT<0>. Furthermore, a word line selected by the target address TR_ADD1 in an unselected second memory block BLK1 is subject to active-precharge (i.e., target refresh) in response to the second block active signal BLK_ACT<1>.

When the read command RD is activated, the data of memory cells connected to the activated word line of the first memory block BLK0 is transferred to the global bus GIO_BUS through the first local bus LIO_BUS0 and outputted outside the memory device. In this case, the data of the first local bus LIO_BUS0 may include the data of memory cells selected by the column address CADD.

A memory device may efficiently manage memory banks by simultaneously performing an active operation on a single word line and a target refresh operation on other word lines in an activated memory bank. In particular, a loss of the data of a memory cell that occurs because an adjacent word line is frequently actived may be prevented through a target refresh.

Figure 5:
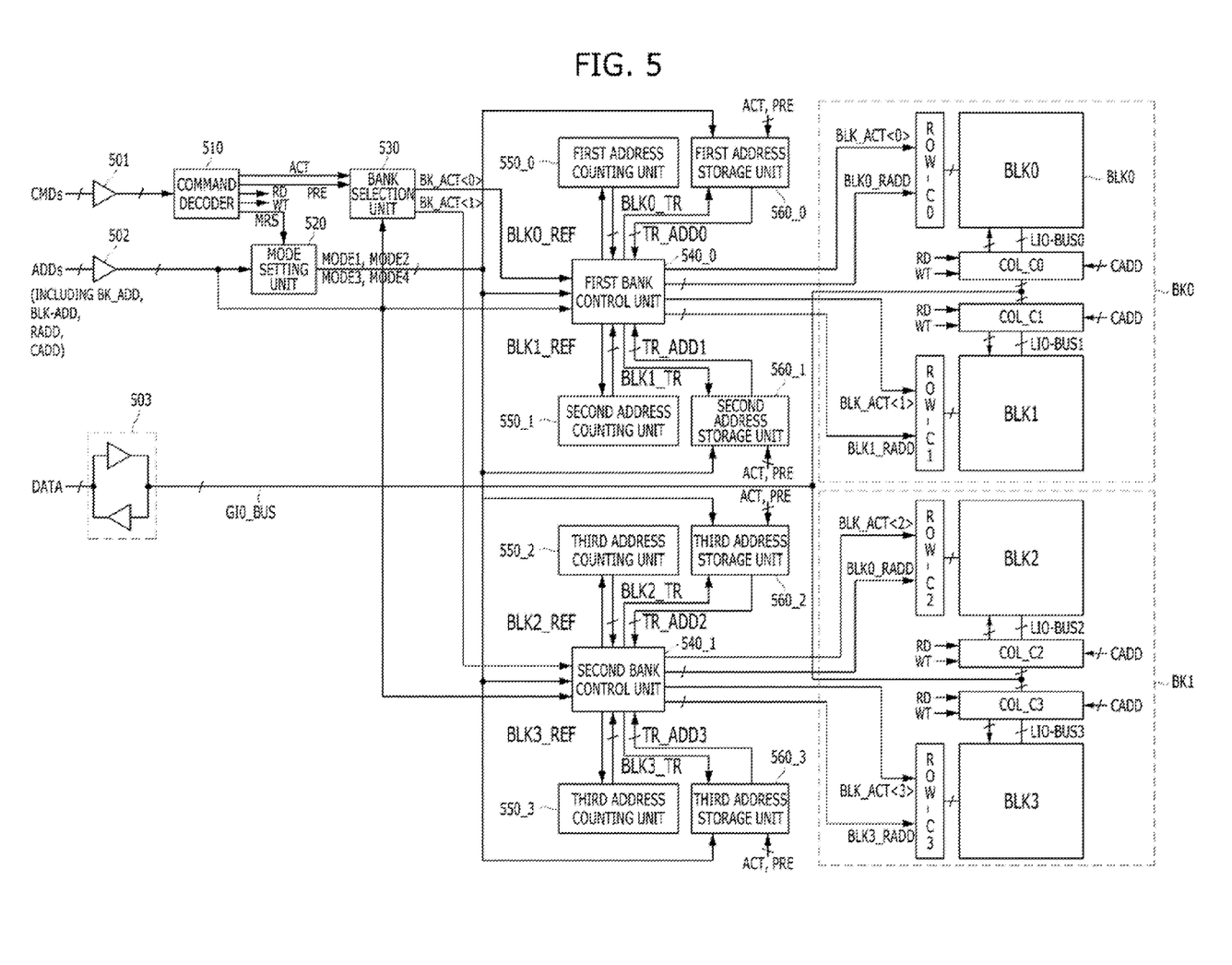
FIG. 5 is a diagram illustrating the configuration of a memory device in accordance with an embodiment of the present invention.

FIG. 5 is a diagram Illustrating the configuration of a memory device in accordance with an embodiment of the present invention.

Referring to FIG. 5, the memory device may include a command input unit 501, an address Input unit 502, a data I/O unit 503, a command decoder 510, a mode setting unit 520, a bank selection unit 530, first and second bank control units 540_0 and 540_1, first and second memory banks BK0 and BK1, a global bus GIO_BUS, first to fourth address counting units 550_0-550_3, and first to fourth address storage units 560_0-560_3.

The memory device of FIG. 5 may perform all the dual mode operations of the memory devices of FIGS. 2 to 4 depending on a set operation mode. That is, the memory device of FIG. 5 may activate a word line of an unselected memory block, perform a normal refresh on the word line of the unselected memory block, or perform a target refresh on the word line of the unselected memory block while activating a word line of a selected memory block.

When a mode register set command MRS is activated, the mode setting unit 520 may set one of operation modes, including a single mode or a dual mode, using addresses ADDs received through the address input unit 502. The single mode may be an operation mode in which a single word line of a selected memory block is activated in an activated memory bank, and the dual mode may be an operation mode in which a word line of another memory block is subject to row access while the single word line of the selected memory block is activated in the activated memory bank.

The first mode of the dual mode may be an operation mode in which two or more word lines are activated in a selected memory bank. Furthermore, the second mode of the dual mode may be an operation mode in which a word line of an unselected memory block is subject to a normal refresh while a word line of a selected memory block is activated, in a selected memory bank. The third mode of the dual mode may be an operation mode in which a word line of an unselected memory block is subject to a target refresh while a word line of a selected memory block is activated in a selected memory bank.

The mode setting unit 520 may activate a mode signal MODE1 if the single mode is set, may activate a mode signal MODE2 if the first mode of the dual mode is set, may activate a mode signal MODE3 if the second mode of the dual mode is set, and may activate a mode signal MODE4 if the third mode of the dual mode is set.

The first and the second bank control units 540_0 and 540_1 may correspond to and control the first and the second memory banks BK0 and BK1, respectively, according to one of the first to fourth modes based on a set mode. The bank control units 540_0 and 540_1 may generate block active signals BLK_ACT<0:3> corresponding to respective memory blocks BLK0-BLK3 included in the first and second memory banks BK0 and BK1.

If the single mode is set, the operation of the bank control unit 540_0 or 540_1 may be the same as that of the bank control unit 240_0 or 240_1 of FIG. 2 that is set in the first mode. If the first mode of the dual mode is set, the operation of the bank control unit 540_0 or 540_1 may be the same as that of the bank control unit 240_0 or 240_1 of FIG. 2 that is set in the dual mode. If the second mode of the dual mode is set, the operation of the bank control unit 540_0 or 540_1 may be the same as that of the bank control unit 340_0 or 340_1 of FIG. 3 that is set in the dual mode. If the third mode of the dual mode is set, the operation of the bank control unit 540_0 or 540_1 may be the same as that of the bank control unit 440_0 or 440_1 of FIG. 4 that is set in the dual mode.

It has been Illustrated in FIGS. 2 to 5 that the memory device is capable of supporting both the single mode and the dual mode. However, the memory device may support only the dual mode through a change of circuit design. It is therefore possible for the memory devices of FIGS. 2 to 5 to operate without the single mode.

Figure 6:
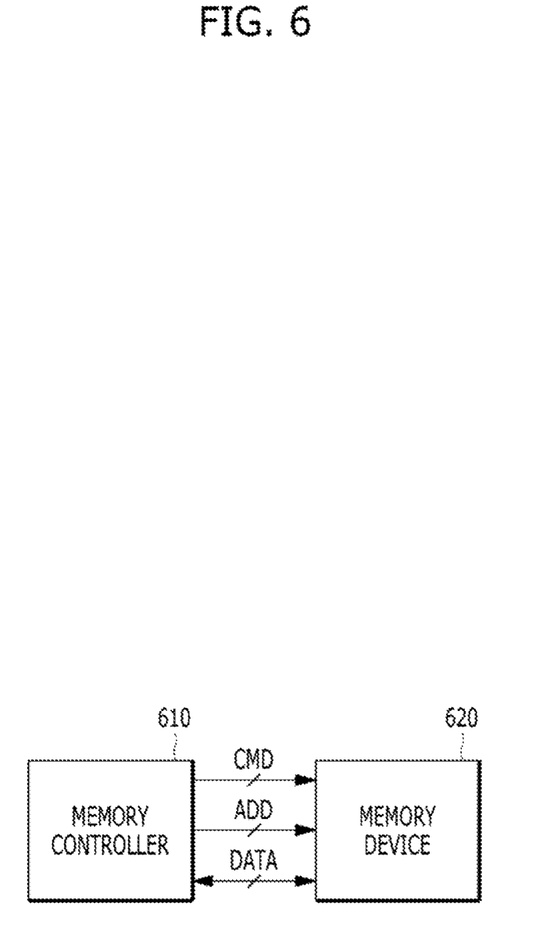
FIG. 6 is a diagram illustrating the configuration of a memory system in accordance with an embodiment of the present invention.

FIG. 6 is a diagram illustrating the configuration of a memory system in accordance with an embodiment of the present invention.

Referring to FIG. 6, the memory system may include a memory controller 610 and a memory device 620.

The memory controller 610 may control the operations of the memory device 620 by inputting commands CMDs and addresses ADDs to the memory device 620 and may exchange data DATA with the memory device 620 when read and write operations are performed. The application of active, precharge, read, write, and mode register set commands to the memory device 620 may be performed by sending the commands CMDs. When refresh and target refresh operations are performed, the memory controller 610 does not need to send the addresses ADDs to the memory device 620 because the addresses CNT_ADD0-CNT_ADD3 and TR_ADD0-TR_ADD3, which are internally generated by the memory device 620, are used.

The memory device 620 may set an operation mode through a mode register set command received from the memory controller 610, through the commands CMDs, and may perform row access on a word line of an unselected memory block in a selected memory bank while activating a word line of a selected memory block in the selected memory bank in response to an active command. The memory device 620 may be any one of the memory devices described with reference to FIGS. 2 to 5.

This technology may increase the bandwidth of a memory device by simultaneously activating two or more word lines and sequentially accessing memory cells connected to the activated word lines in a single memory bank.

Furthermore, this technology may efficiently manage memory banks by simultaneously performing an active operation on a single word line and a refresh operation on another word line in an activated memory bank.

Although various embodiments have been described for Illustrative purposes, it will be apparent to those skilled in the art that various changes and modifications may be made without departing from the spirit and scope of the invention as defined in the following claims.

What is claimed is:

1. A memory device, comprising:
a first memory bank comprising first and second memory blocks;
a second memory bank comprising third and fourth memory blocks, wherein the first to fourth memory blocks include a plurality of word lines; and
a bank selection unit suitable for selecting a memory bank corresponding to a bank address among the first and the second memory banks when an active command is applied,
wherein the selected memory bank
activates a word line corresponding to a row address among the plurality of word lines of an unselected memory block when the selected memory bank is set in a first mode,
performs a normal refresh to refresh a word line corresponding to a counting address among the plurality of word lines of the unselected memory block when the selected memory bank is set in a second mode, and
performs a target refresh to refresh a word line corresponding to a target address among the plurality of word lines of the unselected memory block when the selected memory bank is set in a third mode,
while activates a word line of a memory block that is selected by a block address among memory blocks of the selected memory bank.

2. The memory device of claim 1, wherein the selected memory bank activates a word line corresponding to the row address among word lines of the selected memory block and the word line corresponding to the row address among word lines of the unselected memory block, together.

3. The memory device of claim 2, wherein the selected memory bank performs column access on memory cells connected to the activated word line of the selected memory block, and memory cells connected to an activated word line of the unselected memory block, and
 wherein the column access on the memory cells comprises an operation for writing data in the memory cells and an operation for reading data from the memory cells.

4. The memory device of claim 3, wherein the selected memory bank performs the column access on the selected memory block and the unselected memory block at an interval of column address strobe to column address strobe delay (tCCD).

5. The memory device of claim 3, wherein when a precharge command is applied, the selected memory bank precharges the activated word line of the selected memory block and the activated word line of the unselected memory block.

6. The memory device of claim 1, further comprising:
 an address counting unit suitable for generating the counting address by performing a counting operation,
 wherein the selected memory bank normal-refreshes the word line corresponding to the counting address among word lines of the unselected memory block while activating a word line corresponding to the row address among word lines of the selected memory block.

7. The memory device of claim 1, further comprising:
 an address storage unit suitable for storing an address of a word line having an active number equal to or greater than a reference number, an active frequency equal to or higher than a reference frequency, or an active time equal to or longer than a reference time,
 wherein the selected memory bank target-refreshes an adjacent word line that is adjacent to the word line corresponding to the address of the address storage unit among word lines of the unselected memory block while activating the word line corresponding to a row address among word lines of the selected memory block,
 wherein the adjacent word line corresponds to the target address.

8. The memory device of claim 1, further comprising:
 an address counting unit suitable for generating the counting address by performing a counting operation; and
 an address storage unit suitable for storing an address of a word line having an active number equal to or greater than a reference number, an active frequency equal to or higher than a reference frequency, or an active time equal to or longer than a reference time.

9. The memory device of claim 8, wherein, the selected memory bank performing the target refresh includes
 performing the target refresh to an adjacent word line that is adjacent to the word line corresponding to the address of the address storage unit among the word lines of the unselected memory block,
 wherein the adjacent word line corresponds to the target address.

10. The memory device of claim 1, further comprising:
 a first bank control unit suitable for generating first and second block control signals corresponding to the first and the second memory blocks, respectively, and activating the first and the second block control signals together when the first memory bank is selected;
 a second bank control unit suitable for generating third and fourth block control signals corresponding to the third and the fourth memory blocks, respectively, and activating the third and the fourth block control signals together when the second memory bank is selected; and
 a global bus suitable for transferring data of the selected memory bank.

11. The memory device of claim 10, wherein the first memory bank comprises:
 a first block control unit suitable for activating, normal-refreshing or target-refreshing a word line among the plurality of the first memory block in response to the first block control signal;
 a second block control unit suitable for activating, normal-refreshing or target-refreshing a word line among the plurality of the second memory block in response to the second block control signal;
 a first local bus suitable for transferring data between the first memory block and the global bus;
 a second local bus suitable for transferring data between the second memory block and the global bus; and
 wherein the second memory bank comprises:
 a third block control unit suitable for activating, normal-refreshing or target-refreshing a word line among the plurality of the third memory block in response to the third block control signal;
 a fourth block control unit suitable for activating, normal-refreshing or target-refreshing a word line among the plurality of the fourth memory block in response to the fourth block control signal;
 a third local bus suitable for transferring data between the third memory block and the global bus; and
 a fourth local bus suitable for transferring data between the fourth memory block and the global bus.

12. A memory device, comprising:
 a first memory bank comprising first and second memory blocks;
 a second memory bank comprising third and fourth memory blocks, wherein the first to fourth memory blocks include a plurality of word lines; and
 a bank selection unit suitable for selecting a memory bank corresponding to a bank address among the first and the second memory banks when an active command is applied, and
 in a single mode, the selected memory bank activates a word line of a memory block that is selected by a block address among memory blocks of the selected memory bank, and
 in a dual mode, the selected memory bank activates a word line corresponding to a row address among the plurality of word lines of an unselected memory block when the selected memory bank is set in a first mode of the dual mode, performs a normal refresh to refresh a word line corresponding to a counting address among the plurality of word lines of the unselected memory block when the selected memory bank is set in a second mode of the dual mode, and performs a target refresh to refresh a word line corresponding to a target address among the plurality of word lines of the unselected memory block when the selected memory bank is set in a third mode of the dual mode, while activates the word line of the selected memory block.

13. The memory device of claim 2, wherein in the dual mode, the selected memory bank activates a word line corresponding to the row address among word lines of the selected memory block and a word line that corresponds to the row address among word lines of the unselected memory block together.

14. The memory device of claim 12, further comprising:
an address counting unit suitable for generating the counting address by performing a counting operation,
wherein in the dual mode, the selected memory bank normal- refreshes the word line corresponding to the counting address among word lines of the unselected memory block while activating a word line corresponding to the row address among word lines of the selected memory block.

15. The memory device of claim 12, further comprising:
an address storage unit suitable for storing an address of a word line having an active number equal to or greater than a reference number, an active frequency equal to or higher than a reference frequency, or an active time equal to or longer than a reference time,
wherein in the dual mode, the selected memory bank target-refreshes an adjacent word line that is adjacent to the word line corresponding to the address of the address storage unit among word lines of the unselected memory block while activating a word line corresponding to the row address among word lines of the selected memory block,
wherein the adjacent word line corresponds to the target address.

16. The memory device of claim 12, further comprising:
an address counting unit suitable for generating the counting address by performing a counting operation; and
an address storage unit suitable for storing an address of a word line having an active number equal to or greater than a reference number, an active frequency equal to or higher than a reference frequency, or an active time equal to or longer than a reference time.

17. The memory device of claim 16, wherein the selected memory bank performing the target refresh includes
performing the target refresh to an adjacent word line that is adjacent to the word line corresponding to the address of the address storage unit among the word lines of the unselected memory block,
wherein the adjacent word line corresponds to the target address.

18. The memory device of claim 12, further comprising:
a first bank control unit suitable for generating first and second block control signals corresponding to the first and the second memory blocks, respectively, activating one of the first and the second block control signals when the first memory bank is selected in the single mode, and activating the first and the second block control signals together when the first memory bank is selected in the dual mode;
a second bank control unit suitable for generating third and fourth block control signals corresponding to the third and the fourth memory blocks, respectively, activating one of the third and the fourth block control signals when the second memory bank is selected in the single mode, and activating the third and the fourth block control signals together when the second memory bank is selected in the dual mode; and
a global bus suitable for transferring data of the selected memory bank.

* * * * *